SEMICONDUCTOR DEVICE WITH INTERELECTRODE CAPACITANCE COMPENSATION

Filed Feb. 3, 1966 2 Sheets-Sheet 1

United States Patent Office 3,400,310
Patented Sept. 3, 1968

3,400,310
SEMICONDUCTOR DEVICE WITH INTERELECTRODE CAPACITANCE COMPENSATION

Heinz Dorendorf, Munich, Hugo Rüchardt, Gauting, near Munich, and Hans Rebstock, Munich, Germany, assignors to Siemens Aktiengesellschaft, Munich, Germany, a corporation of Germany

Filed Feb. 3, 1966, Ser. No. 524,886
Claims priority, application Germany, Feb. 9, 1965, S 95,365
20 Claims. (Cl. 317—234)

ABSTRACT OF THE DISCLOSURE

A semiconductor device is compensated for capacitance by a zone of opposite conductivity type positioned in the semiconductor body and having a thickness and a contact surface in common with the contact surface of the semiconductor body. The common contact surface is in contact with a layer of electrical insulation which is positioned on a layer of electrical insulation which in turn is on the contact surface of the semiconductor body. The common contact surface of the zone is larger in area than the contact surface of the layer of conductive material. The common contact surface of the zone is larger in area than the contact surface of the layer of conductive material by substantially three times the thickness of the layer of electrical insulation.

*Description of the invention*

The present invention relates to a semiconductor device with interelectrode capacitance compensation. More particularly, the invention relates to a semiconductor device having an insulation layer between the semiconductor body and the conductive plate of an electrode, with interelectrode capacitance compensation.

The principal object of the present invention is to provide a new and improved semiconductor device with interelectrode capacitance compensation.

In accordance with the present invention, a semiconductor device has a semiconductor body of one conductivity type which has a contact surface, a layer of electrical insulation material on the contact surface of the semiconductor body and a layer of electrically conductive material on the layer of electrical insulation. The layer of electrically conductive material has a thickness and a surface in contact with the layer of electrical insulation. In accordance with the present invention, the interelectrode capacitance of the semiconductor device is compensated by a zone of opposite conductivity type positioned in the semiconductor body and having a determined thickness and a contact surface in common with the contact surface of the semiconductor body. The common contact surface is in contact with the layer of electrical insulation. The common contact surface of the zone is larger than the contact surface of the layer of conductive material. The zone of opposite conductivity type has an electrical resistance which is low in magnitude relative to the electrical resistance of the semiconductor body. The zone of opposite conductivity type has a thickness in the range of 0.2 to 10.0 micrometers determined to decrease capacitance between the zone of opposite conductivity type and the layer of electrically conductive material and to decrease capacitance between the zone of opposite conductivity type and the semiconductor body. The dimensions of the common contact surface of the zone of opposite conductivity type are larger than the dimensions of the surface of the layer of electrically conductive material. The area of the common contact surface is larger than the area of the surface by substantially three times the thickness of the layer of electrical insulation.

In another embodiment of the present invention, the zone of opposite conductivity type is connected to a point at ground potential or has a stable reference potential applied to it. In still another embodiment of the invention, the semiconductor device comprises a planar type transistor utilizing the semiconductor body as a collector zone and has a base zone of opposite conductivity type from the one conductivity type of the semiconductor body positioned in the semiconductor body in spaced relation from the zone of opposite conductivity type and having a determined thickness and a contact surface in common with the contact surface of the semiconductor body and an emitter zone of the same conductivity type as the one conductivity type positioned in the semiconductor body in the base zone and having a contact surface in common with the contact surface of the semiconductor body. The thickness of the base zone is greater than the thickness of the zone of opposite conductivity type. The zone of opposite conductivity type and the base zone are spaced by a distance sufficient to prevent short circuiting. The zone of opposite conductivity type and the base zone are positioned in eccentric relation to each other and the thickness of the zone of opposite conductivity type is at least three times the thickness of the layer of electrical insulation. Emitter potential is applied to the zone of opposite conductivity type by electrically connecting the emitter zone and the zone of opposite conductivity type.

In order that the present invention may be readily carried into effect, it will now be described with reference to the accompanying drawing, wherein.

Figure 1:
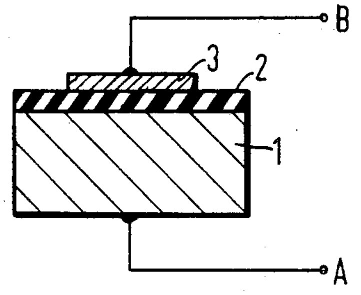
FIG. 1 is a sectional view of an embodiment of a semiconductor device having an insulation layer between the semiconductor body and the conductive plate of an electrode.

FIG. 1 shows a semiconductor device having an insulation layer between the semiconductor body and the conductive layer or plate of an electrode. The semiconductor device of FIG. 1, in which a layer of electrical insulation is positioned between the semiconductor body and the conductive layer or plate of an electrode, is quite common, especially in planar transistors, diodes and integrated circuits. A semiconductor body 1 may comprise, for example, silicon of n conductivity type. A layer of electrical insulation 2 may comprise, for example, silicon dioxide, and is positioned on the semiconductor body 1. An electrically conductive plate or layer 3 is positioned on the insulation layer 2. The layer 3 may comprise, for example, a metal film provided by vapor deposition, a layer of electrically conductive dopant material, or the like.

Figure 2:
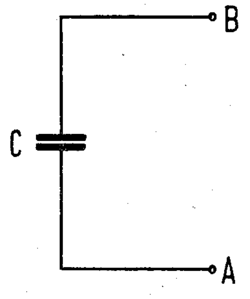
FIG. 2 is an equivalent circuit for the interelectrode capacitance of the semiconductor device of FIG. 1.

A semiconductor device of the type of FIG. 1 has an interelectrode capacitance between the electrodes A and B which is often undesirable. This may be due to the insulation layer 2. The interelectrode capacitance C in FIG. 2 is the interelectrode capacitance between the electrodes A and B of the semiconductor device of FIG. 1. In accordance with the present invention, the interelectrode capacitance C, which is most often undesirable such as, for example, in an amplifier device, in which it seriously influences the electrical operation, is compensated.

Figure 3:
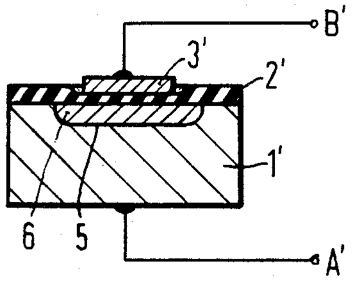
FIG. 3 is a sectional view of an embodiment of the semiconductor device of the present invention with interelectrode capacitance compensation.

FIG. 3 illustrates an embodiment of the present invention in which a zone or region of opposite conductivity type is provided in the semiconductor body adjacent the insulation layer. In accordance with the invention, the area or cross-sectional area or contact surface with the insulation layer of the zone of opposite conductivity type is greater than the area or cross-sectional area or contact surface with the insulation layer of the conductive layer and the ratio of the opposite conductivity zone area to the conductive layer area is selected to compensate for the capacitance of the conductive layer and the zone of opposite conductivity type. That is, the opposite conductivity type zone is capacitively shielded from the conductive layer.

In FIG. 3, a semiconductor body 1′ may comprise, for example, silicon of n conductivity type. A layer of electrical insulation 2′ may comprise, for example, silicon dioxide, and is positioned on the semiconductor body 1′. A zone or region 6 of opposite conductivity type, that is, of p conductivity type, may comprise silicon of p conductivity type, for example. An electrically conductive layer 3′ is positioned on the insulation layer 2′.

Figure 4:
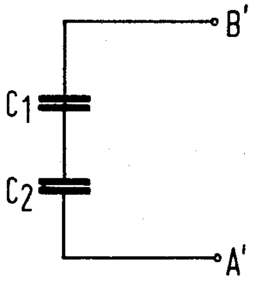
FIG. 4 is an equivalent circuit of the interelectrode capacitance of the semiconductor device of FIG. 3.

As shown in FIG. 4, the interelectrode capacitance of the semiconductor device of FIG. 3, that is, the capacitance between the semiconductor body 1′ and the conductive layer 3′, comprises a first capacitance C1 and a second capacitance C2 connected in series circuit between the electrodes A′ and B′ of the semiconductor device of FIG. 3. The first capacitance C1 is the capacitance between the conductive layer 3′ and the zone 6 and the second capacitance C2 is the capacitance between the zone 6 and the semiconductor body 1′, which is the capacitance of the pn junction 5 between said zone and said body. The first and second capacitances C1 and C2 are connected in opposed relationship.

Since the resultant capacitance of series connected capacitances has a magnitude which is less than the capacitance of smallest magnitude of the series connection, the interelectrode capacitance is compensated by the opposite conductivity zone 6 which provides the series connected capacitances. Thus, the relatively small capacitance C2 of the pn junction 5, which is in opposed relation, is provided in series circuit connection with the capacitance C1 between the conductive layer 3′ and the zone 6.

Figure 5:
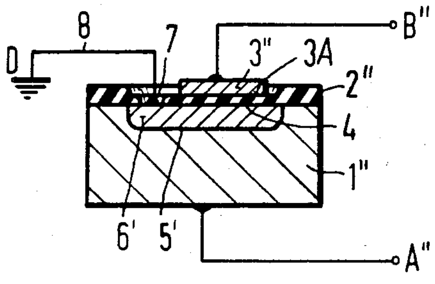
FIG. 5 is a sectional view of another embodiment of the semiconductor device of the present invention with interelectrode capacitance compensation.

A disadvantage of the embodiment of FIG. 3 is that the capacitance C2 of the pn junction 5 causes amplitude distortion of a signal amplified by said embodiment. This disadvantage is overcome by the embodiment of FIG. 5 in which the opposite conductivity zone 6′ is connected to a source of stable reference potential. The source of stable reference potential may comprise a point at ground potential, as shown in FIG. 5. In FIG. 5, a semiconductor body 1″ may comprise, for example, silicon of n conductivity type. A layer of electrical insulation 2″ may comprise, for example, silicon dioxide, and is positioned on the semiconductor body 1″. A zone or region 6′ of opposite conductivity type, that is, of p conductivity type, may comprise silicon of p conductivity type, for example. The opposite conductivity zone is provided in the semiconductor body 1″ adjacent the insulation layer 2″. An electrically conductive layer 3″ is positioned on the insulation layer 2″. The opposite conductivity zone 6′ is connected to a point at ground potential via a lead 8 which is passed through an aperture 7 formed through the insulation layer 2″ in order to contact said zone.

Figure 6:
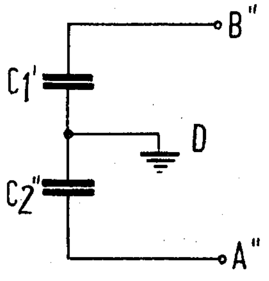
FIG. 6 is an equivalent circuit of the interelectrode capacitance of the semiconductor device of FIG. 5.

As shown in FIG. 6, the interelectrode capacitance of the semiconductor device of FIG. 5 is the same as that of the semiconductor device of FIG. 3, and comprises a first capacitance C1′ between the conductive layer 3″ and the zone 6′ and a second capacitance C2′ between the zone 6′ and the semiconductor body 1″ connected in series circuit between the electrodes A″ and B″ of the semiconductor device of FIG. 5. The difference between the interelectrode capacitance of the devices of FIGS. 3 and 5 is that a common point in the connection between the first and second capacitances C1′ and C2′, respectively, is connected to a point D at ground potential. This eliminates the common capacitance of the electrodes A″ and B″. The first capacitance C1′ between the electrode A″ and the point D at ground potential and the second capacitance C2′ between the electrode B″ and said point D are not detrimental in many applications of the semiconductor device of FIG. 5. These capacitances may be varied in magnitude by outside circuitry and are frequently of small magnitude relative to the capacitance of the power supply leads.

In order to maintain at small magnitudes the interelectrode capacitances of the semiconductor device which are present after the opposite conductivity zone 6 or 6′ has been provided, the thickness of the opposite conductivity zone should not be too small. If the thickness of the opposite conductivity zone 6 or 6′ is too small, the capacitance of the pn junction 5 or 5′ cannot be sufficiently decreased because the space charge region within said zone cannot expand to a sufficient extent. Thus, the thickness of the opposite conductivity zone 6 or 6′, although the zone 6 is at a floating potential, should be greater than one micrometer, since the decrease in interelectrode capacitance is determined to a great extent by the capacitance of the pn junction 5 or 5′.

The capacitances of the semiconductor device which are present after the opposite conductivity zone 6 or 6′ has been provided may be decreased in magnitude or compensated in other ways, depending upon the utilization of the semiconductor device. If such is the case, the thickness of the opposite conductivity zone 6 or 6′ may be from 0.2 to 10.0 micrometers. In a high frequency transistor, the thickness of the opposite conductivity zone may have a magnitude at the lower limits, whereas in other types of transistor the thickness of said zone may have a magnitude at the upper limits since the thickness of said zone depends upon the thickness of the base electrode of the transistor.

In order to decrease the capacitance of the pn junction 5 or 5′ as much as possible, the zone 6 or 6′ of opposite conductivity should have a sufficiently high electrical resistance. On the other hand, the electrical resistance of the opposite conductivity zone 6 or 6′ should be low enough in magnitude to permit a build-up of potential to the conductive layer 3′ or 3″, especially when the zone 6′ is at ground potential. The electrical resistance of the zone 6′ of opposite conductivity type should be very low in magnitude relative to the electrical resistance or capacitive reactance of the semiconductor body 1′ or 1″. A preferable electrical resistance for the opposite conductivity zone is 10.0 to 500.0 ohms per unit area.

The area or cross-sectional area or contact surface 4 of the opposite conductivity zone 6′ with the insulation layer 2″ should be larger than the area or cross-sectional area or contact surface 3A of the conductive layer 3″ with said insulation layer. The difference in contact surfaces 4 and 3A should be large enough to decrease as much as possible stray capacitances occurring at the edges of the conductive layer 3″. The contact surface 4 of the opposite conductivity zone 6′ is preferably larger than the contact surface 3A of the conductive layer 3″ by three times the thickness of the insulation layer 2″, although said zone and said conductive layer be positioned non-concentrically or non-coaxially. The contact surface 4 of the opposite conductivity zone 6′ should be larger than the contact surface 3A of the conductive layer 3″ by at least one third the thickness of the insulation layer 2″ at any point on the peripheral edge of the contact surface 3A. In a high frequency device and especially in a high frequency transistor, the insulation layer 2″ may have a thickness of 2 micrometers. Thus, in order to compensate for stray capacitances, the contact surface 4 of the zone 6′ of opposite conductivity type should be at least 6 micrometers larger than the contact surface 3A of the conductive layer 3″.

The conductive layer 3, 3′ or 3″ comprises an electrically conductive metal, which may be vapor deposited or provided as a layer of electrically conductive dopant material, or the like, which functions as an electrode for the semiconductor device. A semiconductor device or transistor of planar type, which is compensated for interelectrode capacitance in accordance with the present invention, may be utilized to advantage in non-neutralized amplifier stages, especially of broad-band and HF amplifiers.

Figure 8:
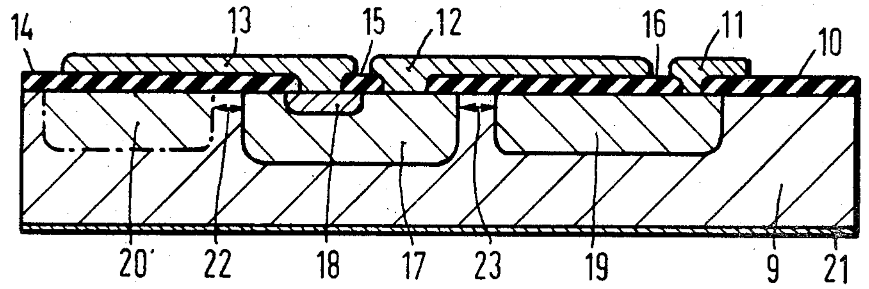
FIG. 8 is a view taken along the lines VIII—VIII of FIG. 7.
Figure 7:
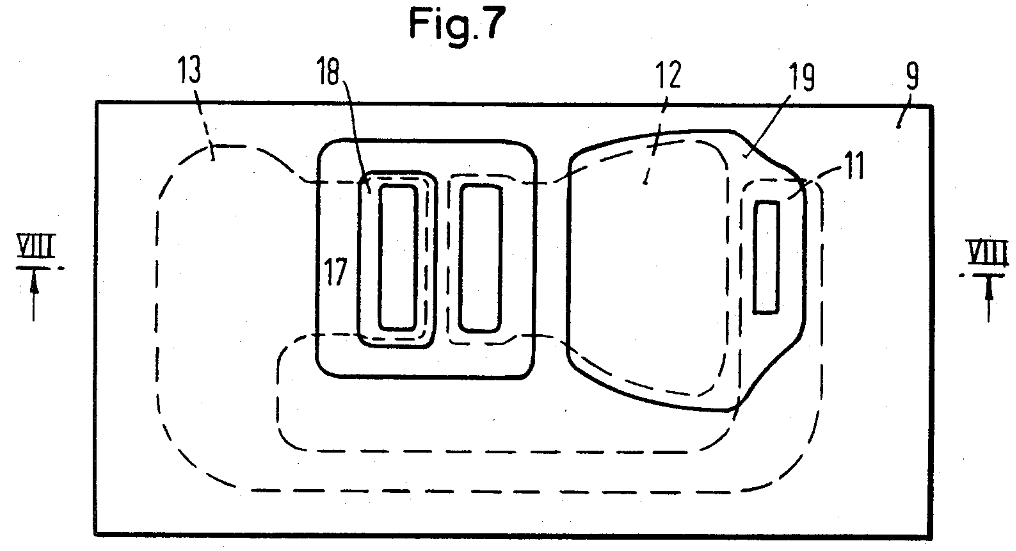
FIG. 7 is a plan view of still another embodiment of the semiconductor device of the present invention with interelectrode capacitance compensation.
Figure 9:
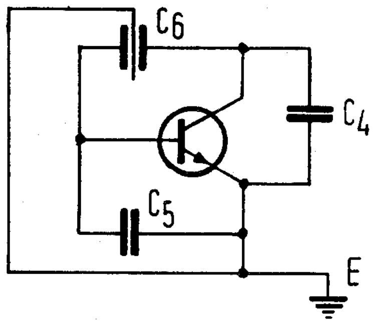
FIG. 9 is a circuit indicating the interelectrode capacitance of the semiconductor device of FIGS. 7 and 8.

FIGS. 7 and 8 are views of still another embodiment of the semiconductor device of the present invention and FIG. 9 is a circuit showing the interelectrode capacitance of the semiconductor device of FIGS. 7 and 8. The semiconductor device of FIGS. 7 and 8 is a planar type transistor. A semiconductor body 9 may comprise, for example, silicon of n conductivity type. The semiconductor body 9 comprises a base region or zone 17 of p conductivity type, an emitter region or zone 18 of n conductivity type. The base and emitter zones 17 and 18 may be formed in the semiconductor body 9 by a diffusion technique utilized with planar type transistors.

A layer of electrical insulation 10 may comprise, for example, silicon dioxide and is positioned on the semiconductor body 9. The insulation layer 10 has a plurality of apertures formed therethrough to enable contact with the base and emitter zones 17 and 18. Electrically conductive layers or plates 12 and 11, 13 are positioned on the insulation layer 10 and may comprise metal films provided by vapor deposition or a layer of electrically conductive dopant material, or the like. The conductive layer 11, 13 electrically contacts the emitter zone 18 and provides an electrode for an electrical terminal. The conductive layer 12 electrically contacts the base zone 17 and provides an electrode for another electrical terminal.

In a semiconductor device utilized as an amplifier, the interelectrode capacitance influences the electrical operation. The interelectrode capacitance is produced in the emitter circuit by the base zone contact surface and is compensated by the embodiment of FIGS. 7 and 8. A base zone contact surface of 60 by 60 micrometers, as utilized in high frequency transistors, produces an additional interelectrode capacitance of 0.25 micromicrofarad between the collector and base electrodes when the insulation layer 10 is 0.5 micrometer. Such additional interelectrode capacitance between the collector and base electrodes is compensated, in the embodiment of FIGS. 7 and 8, by a zone or region 19 of opposite conductivity type such as, for example, silicon of p conductivity type.

The opposite conductivity type zone 19 compensates for the additional interelectrode capacitance between the collector and base electrodes produced by the base zone contact with the conductive layer in the base zone 17 and produces instead further interelectrode capacitances which are considerably less detrimental or undesirable. The further interelectrode capacitances are between the base zone 17 and the opposite conductivity zone 19 and between the semiconductor body 9 or collector electrode and the opposite conductivity zone 19. The opposite conductivity zone 19 is electrically connected to the emitter zone 18 by the conductivity layer 11, 13. Thus, in the semiconductor device of FIGS. 7 and 8, the stable reference potential is the emitter potential.

The conductivity layer 11, 13, as shown by broken lines in FIG. 7, is of substantially U-shaped configuration with an inwardly extending portion of one arm 13 contacting the emitter zone 18 through an aperture formed through the insulating layer 10 and with the other arm 11 contacting the opposite conductivity zone 19 through another aperture formed through said insulating layer. The conductivity layer 12, which makes electrical contact with the base zone 17 through an aperture through the insulation layer 10, is shown by broken lines in FIG. 7 and is spaced from the conductivity layer 11, 13.

As shown in FIG. 9, the opposite conductivity type zone 19, which is maintained at the emitter potential via the conductivity layer 11, 13, compensates for the interelectrode capacitance C6 between the base and collector electrodes. The capacitance between the opposite conductivity zone 19 and the base electrode is connected in parallel with the interelectrode capacitance C5 between the base and emitter electrodes and the interelectrode capacitance C4 appears between the emitter and collector electrodes. Although the capacitances between the collector and emitter electrodes and between the base and emitter electrodes are produced by the utilization of the opposite conductivity type zone 19, the capacitance between the base and the collector electrodes is compensated.

It is possible, of course, that the interelectrode capacitance C4 between the emitter zone 18 and the collector zone or semiconductor body 9 may be undesirable or detrimental in specific circuit applications such as, for example, grounded base circuits. The interelectrode capacitance C4 may be compensated by an additional zone or region 20 of opposite conductivity type such as, for example, silicon of p conductivity type, as shown in broken lines in FIG. 8. Both opposite conductivity zones 19 and 20 may be utilized in a single semiconductor device. A stable reference potential may be applied to the additional opposite conductivity type zone 20 in the same manner as a stable reference potential is applied to the opposite conductivity type zone 19, that is, by a conductivity layer and an aperture formed through the insulation layer 10 to the surface of the zone 20. If both opposite conductivity zones 19 and 20 are utilized in a single semiconductor device, either of said zones may have a stable reference potential applied thereto, depending upon the use of said semiconductor device.

In the embodiment of FIGS. 7 and 8, the opposite conductivity zone is positioned in eccentric relation to the base zone 17 and to the emitter zone 18. The opposite conductivity zone is positioned in the semiconductor body 9 and has a common surface with said semiconductor body to which the insulation layer 10 is applied. The base zone 17 extends farther into the semiconductor body 9 than the opposite conductivity zone since it has a common surface with said semiconductor body, as does said opposite conductivity zone, but said base zone also has a greater thickness than said opposite conductivity zone. The thickness of the opposite conductivity zone 19 or 20 should be at least three times the thickness of the insulation layer 10 which includes portions 14, 15 and 16. The thickness is measured perpendicularly from the common surface of the semiconductor body 9 and the opposite conductivity zone 19, the base zone 17 and the emitter zone 18, such common surface being contacted by the insulation layer 10 and conductivity layers 12 and 11, 13. The thickness of the opposite conductivity zone should be of suffcient magnitude to compensate for or shield against stray capacitances occurring at the edge of the contact surface.

The planar type transistor of FIGS. 7 and 8 is manufactured by known technique. The opposite conductivity zone 19 is preferably provided simultaneously with the base zone 17. Since the opposite conductivity zone 19 and the base zone 17 have the same conductivity type, they may be provided in a single diffusion process. A space 23 is provided between the opposite conductivity zone 19 and the base zone 17 in the semiconductor body 9 to prevent short circuits between said zones and a space 22 is provided between the opposite conductivity zone 20, if such is utilized, and the base zone 17 in the semiconductor body 9 to prevent short circuits between said said zones (FIG. 8). The spaces 23 and 22 are kept as small as possible in order to properly compensate for the interelectrode capacitances between the semiconductor body or collector electrode 9 and the emitter zone 18 or the base zone 17.

Although the semiconductor body and the various zones or regions thereof have been described herein as silicon, they may, of course, comprise any suitable semiconductor material such as, for example, germanium or suitable semiconductor compounds such as $A^{III}B^{V}$ or other suitable compounds. Furthermore, the insulation layer may comprise any suitable electrical insulation material, although such insulation layer has been described herein as silicon dioxide.

The insulation layer 10 may have an aperture formed therethrough at the surface of the base zone 17 and a layer of electrically conductive material may be provided in electrical contact with the opposite conductivity zone 19 and with said base zone via said aperture and the aperture at the surface of said opposite conductivity zone. The opposite conductivity zone 19 would then be at the potential of the base electrode or base zone 17. The additional opposite conductivity zone 20 may be placed at the potential of the base electrode in the same manner.

While the invention has been described by means of specific examples and in specific embodiments, we do not wish to be limited thereto, for obvious modifications will occur to those skilled in the art without departing from the spirit and scope of the invention.

We claim:

1. In a semiconductor device having a semiconductor body of one conductivity type having a contact surface, a layer of electrical insulation material on the contact surface of said semiconductor body, a layer of electrically conductive material on said layer of electrical insulation, said layer of electrically conductive material having a thickness and a surface in contact with said layer of electrical insulation, capacitance compensating means comprising a zone of opposite conductivity type positioned in said semiconductor body and having a thickness and a contact surface in common with the contact surface of said semiconductor body, said common contact surface being in contact with said layer of electrical insulation, the common contact surface of said zone being larger than the contact surface of said layer of conductive material.

2. In a semiconductor device as claimed in claim 1, wherein said zone of opposite conductivity type has an electrical resistance which is low in magnitude relative to the electrical resistance of said semiconductor body.

3. In a semiconductor device as claimed in claim 2, wherein said zone of opposite conductivity type has an electrical resistance in the range of 10.0 to 500.0 ohms per unit area.

4. In a semiconductor device as claimed in claim 1, wherein the thickness of said zone of opposite conductivity type is determined to decrease capacitance between said zone of opposite conductivity type and said layer of electrically conductive material and to decrease capacitance between said zone of opposite conductivity type and said semiconductor body.

5. In a semiconductor device as claimed in claim 1, wherein said zone of opposite conductivity type has a thickness in the range of 0.2 to 10.0 micrometers.

6. In a semiconductor device as claimed in claim 1, wherein said zone of opposite conductivity type has a thickness in the range of 1.0 to 10.0 micrometers.

7. In a semiconductor device as claimed in claim 1, wherein the dimensions of the common contact surface of said zone of opposite conductivity type are larger than the dimensions of the surface of said layer of electrically conductive material.

8. In a semiconductor device as claimed in claim 1, wherein said layer of electrical insulation has a determined thickness and wherein the area of said common contact surface is larger than the area of said surface by substantially three times the thickness of said layer of electrical insulation.

9. In a semiconductor device as claimed in claim 1, wherein said layer of electrically conductive material comprises a dopant.

10. In a semiconductor device as claimed in claim 1, wherein said interelectrode capacitance compensating means further comprises means for applying a stable reference potential to said zone of opposite conductivity type.

11. In a semiconductor device as claimed in claim 10, wherein said zone of opposite conductivity type is connected to a point at ground potential.

12. In a semiconductor device as claimed in claim 1, wherein said semiconductor device comprises a planar type transistor utilizing said semiconductor body as a collector zone and having a base zone of opposite conductivity type from the one conductivity type of said semiconductor body positioned in said semiconductor body in spaced relation from said zone of opposite conductivity type and having a thickness and a contact surface in common with the contact surface of said semiconductor body and an emitter zone of the same conductivity type as said one conductivity type positioned in said semiconductor body in said base zone and having a contact surface in common with the contact surface of said semiconductor body, and wherein the thickness of said base zone is greater than the thickness of said zone of opposite conductivity type.

13. In a semiconductor device as claimed in claim 12, wherein said zone of opposite conductivity type and said base zone are spaced by a distance sufficient to prevent short circuiting.

14. In a semiconductor device as claimed in claim 12, wherein said layer of electrical insulation has a thickness and wherein said zone of opposite conductivity type and said base zone are positioned in eccentric relation to each other and the thickness of said zone of opposite conductivity type is at least three times the thickness of said layer of electrical insulation.

15. In a semiconductor device as claimed in claim 12, wherein said semiconductor device further comprises means for applying emitter potential to said zone of opposite conductivity type.

16. In a semiconductor device as claimed in claim 12, wherein said layer of electrical insulation includes apertures formed therethrough and said layer of electrically conductive material is in electrical contact with each of said zone of opposite conductivity type and said emitter zone thereby applying emitter potential to said zone of opposite conductivity type.

17. In a semiconductor device as claimed in claim 12, wherein said capacitance compensating means further comprises an additional zone of opposite conductivity type from the determined conductivity type of said semiconductor body in spaced relation from said base zone and said zone of opposite conductivity type.

18. In a semiconductor device as claimed in claim 12, wherein said semiconductor device further comprises means for applying base potential to said zone of opposite conductivity type.

19. In a semiconductor device as claimed in claim 18, wherein said capacitance compensating means further comprises an additional zone of opposite conductivity type from the one conductivity type of said semiconductor body in spaced relation from said base zone and said zone of opposite conductivity type.

20. In a semiconductor device as claimed in claim 17, wherein said additional zone of opposite conductivity type is at a floating potential.

References Cited

UNITED STATES PATENTS

| | | | |
|---|---|---|---|
| 3,202,891 | 8/1965 | Frankl | 317—235 |
| 3,204,160 | 8/1965 | Chek-Tang Sah | 317—234 |

JAMES D. KALLAM, *Primary Examiner*.